(12) United States Patent
Shimoda et al.

(10) Patent No.: US 6,733,821 B1
(45) Date of Patent: May 11, 2004

(54) METHOD FOR FORMING AN OPTICAL COMPONENT

(75) Inventors: Kazuhito Shimoda, Kanagawa (JP); Junichi Ohsako, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/688,541

(22) Filed: Oct. 16, 2000

(30) Foreign Application Priority Data

Oct. 15, 1999 (JP) .......................... P11-294406

(51) Int. Cl.$^7$ .............................. G02B 1/10; B05D 5/06
(52) U.S. Cl. ............................ 427/10; 427/9; 427/162; 427/419.3; 359/580; 359/588; 118/677; 118/679; 216/24; 216/37
(58) Field of Search .................... 427/8, 9, 10, 162, 427/163.1, 163.2, 164, 166, 402, 419.3; 359/580, 581, 586, 587, 588; 118/668, 672, 677, 679, 684; 216/24, 37

(56) References Cited

U.S. PATENT DOCUMENTS

| | | | | |
|---|---|---|---|---|
| 4,311,725 A | * | 1/1982 | Holland ........................ | 427/10 |
| 5,068,568 A | * | 11/1991 | de Vrieze et al. ........... | 313/112 |
| 5,483,378 A | * | 1/1996 | Rahn ............................. | 216/24 |
| 5,648,115 A | * | 7/1997 | Bandyopadhyay et al. . | 427/107 |
| 5,754,297 A | * | 5/1998 | Nulman ................... | 250/559.27 |
| 5,911,856 A | | 6/1999 | Suzuki et al. | |
| 6,217,720 B1 | * | 4/2001 | Sullivan et al. ........ | 204/192.13 |

FOREIGN PATENT DOCUMENTS

| | | |
|---|---|---|
| EP | 0652304 A1 | 5/1995 |
| EP | 0834596 A1 | 8/1998 |
| GB | 2029017 A | 3/1980 |
| JP | 03226573 | 7/1991 |
| JP | 11-119002 A * | 4/1999 |

* cited by examiner

*Primary Examiner*—Shrive P. Beck
*Assistant Examiner*—Wesley D. Markham
(74) *Attorney, Agent, or Firm*—Sonnenschein, Nath & Rosenthal LLP

(57) ABSTRACT

A method for forming an optical component includes (i) depositing optical layers on a base, and (ii) controlling a thickness of a tuning layer by (a) depositing the tuning layer on the optical layers, (b) measuring a first optical characteristic, (c) measuring a second optical characteristic after continued deposition of the tuning layer, (d) determining whether the second optical characteristic has decreased compared to the first optical characteristic, (e) when the second optical characteristic has not decreased, continuing deposition of the tuning layer and returning to steps (ii)(b)–(e), when the second optical characteristic has decreased, terminating the depositing and removing a portion of the tuning layer formed during a period of time defined from when an increase/decrease of the second optical characteristic is stopped to when the second optical characteristic is changed to be decreased, and (f) adding a layer of a lower refractive index on the tuning layer.

3 Claims, 15 Drawing Sheets

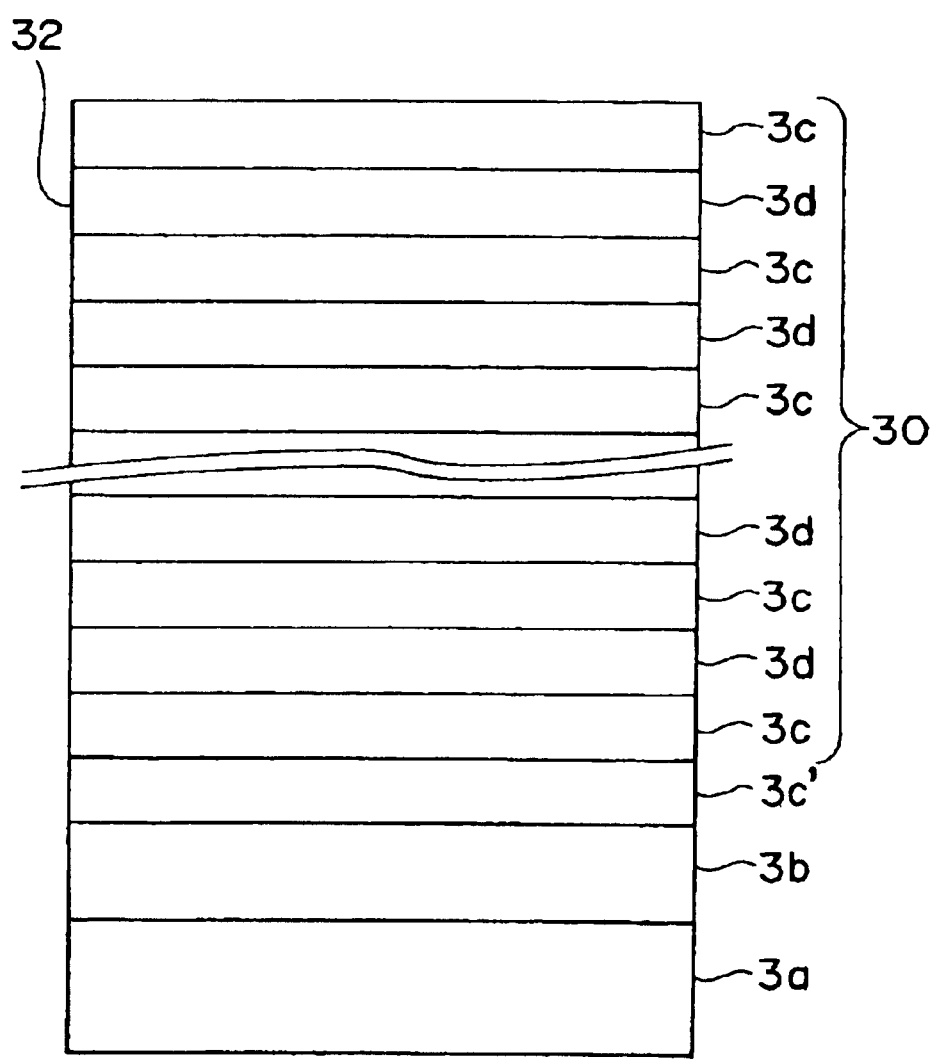

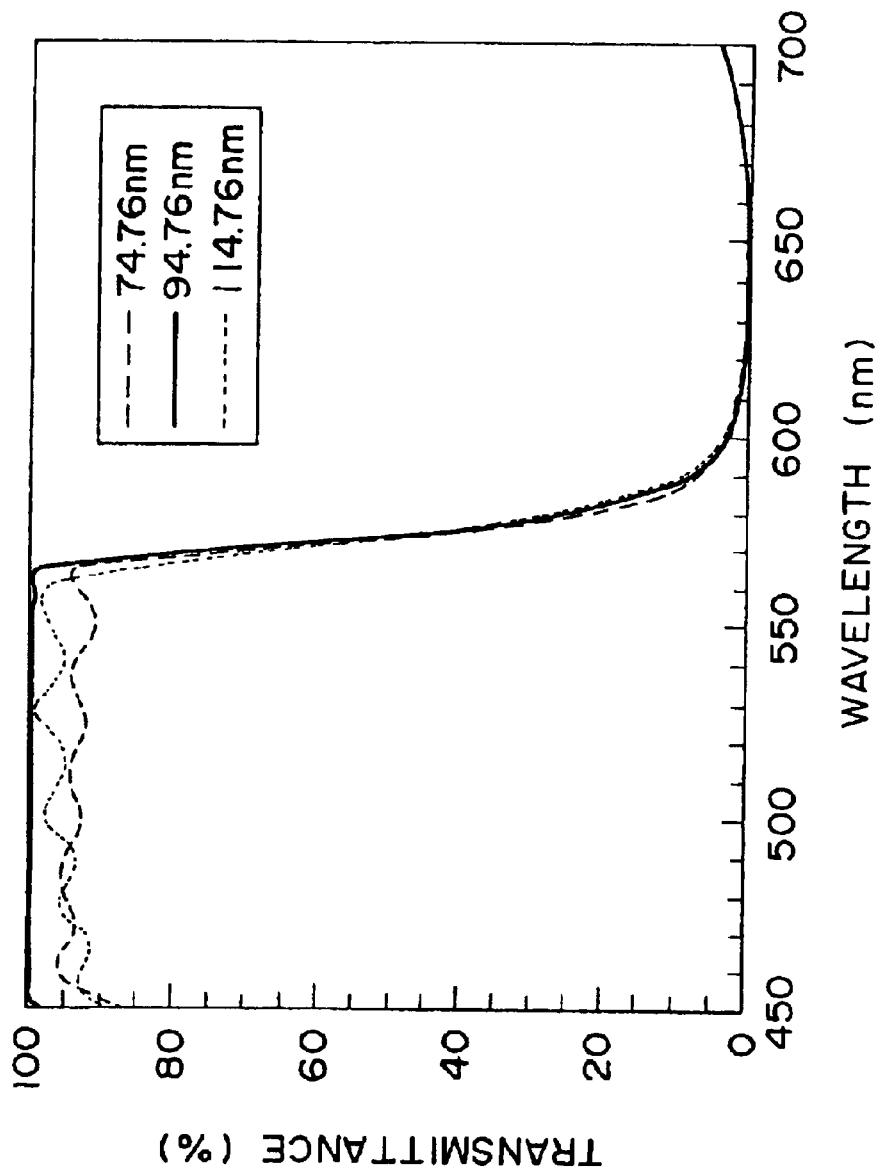

METHOD FOR FORMING AN OPTICAL COMPONENT

RELATED APPLICATION DATA

The present application claims priority to Japanese Applications No. P11-294406 filed Oct. 15, 1999, which application is incorporated herein by reference to the extent permitted by law.

BACKGROUND OF THE INVENTION

The present invention relates to an apparatus and a method for producing an optical component by forming a multi-layer film on a base.

To realize good optical characteristics of an optical component comprised of an optical film, such as a dichroic mirror, the optical film is required to be of a multi-layer structure having at least ten optical thin layers. The optical thin layer is formed by a low refractive index material such as $MgF_2$ or $SiO_2$ or a high refractive index material such as $TiO_2$ or $Nb_2O_5$. A usual batch process used for producing an optical component comprised of an optical film having a multi-layer structure of optical thin layers involves evaporating raw materials for the optical thin layers in a vacuum system in accordance with a vapor-deposition process or sputtering process, to form the optical thin layers on a transparent member such as a glass board.

One example of a related art method of producing an optical component by forming an optical film having a multi-layer structure of optical thin layers has been disclosed in Japanese Patent Laid-open No. Hei 11-119002.

In accordance with this method, optical thin layers are continuously formed on a base, typically, a film in such a manner that the configuration of the optical thin layers is adjusted to a predetermined optically designed configuration as a whole, by forming the optical thin layers on the base, and simultaneously controlling a thickness of each layer to satisfy a specific light transmission characteristic by using, for example, an optical monitor.

The method disclosed in the above document, Japanese Patent Laid-open No. Hei 11-119002, however, has the following problems: namely, since the method fails in means for accurately measuring a thickness of each of optical thin layers continuously formed on the base such as film, the thickness of the optical thin layer intended to be adjustably formed is, really, inaccurately measured. This gives rise to not only a problem that the optical component produced by this method cannot exhibit ideal optical characteristics due to a deviation of the thickness of each optical thin layer from the ideal thickness, but also a problem that a variation in optical characteristics occurs between optical components produced by this method.

For example, as shown in FIG. 14, when each optical thin layer is formed at a usual formation rate in accordance with the related art method, an optical characteristic represented by a light transmittance is largely changed due to a change in thickness of the optical thin layer. In the figure, values "74.76 nm", "194.76 nm", and "114.76 nm" designate the thicknesses of the optical thin layers. Even when each optical thin layer is formed at a formation rate slower than the usual rate in accordance with the related art method, as shown in FIG. 15, an optical characteristic represented by a light transmittance is largely changed due to a change in thickness of the optical thin layer. In the figure, values "0 nm", "65.5 nm", "97.3 nm" and "112.4 nm" designate the thicknesses of the optical thin layers.

The above related art method has a further problem that since the film thickness adjustment is performed for each of optical thin layers constituting an optical film, it takes a lot of time to form the optical film composed of the optical thin layers.

SUMMARY OF THE INVENTION

An object of the present invention is to provide an apparatus and a method for producing an optical component, each of which is capable of easily, stably producing an optical component having good optical characteristics.

To achieve the above object, according to a first aspect of the present invention, there is provided an optical component producing apparatus for forming a multi-layer film, which is composed of alternately stacked layers different in optical characteristic, on a base, the apparatus including: film formation means for forming the multi-layer film on the base; measurement means for measuring an optical characteristic of the optical component obtained by forming the multi-layer film on the base; and control means for controlling a thickness of a portion of the multi-layer film formed by the film formation means on the basis of the measured optical characteristic of the optical component.

According to a second aspect of the present invention, there is provided an optical component producing method for forming a multi-layer film, which is composed of alternately stacked layers different in optical characteristic, on a base, the method including: measuring an optical characteristic of the optical component obtained by forming the multi-layer film on the base; and controlling, on the basis of the measured optical characteristic of the optical component, a thickness of a portion of the multi-layer film to be formed on the base.

With these configurations, layers of a multi-layer film are formed one by one on the base (by the film formation means), wherein an optical characteristic of an optical component obtained by forming the multi-layer film on the base is measured (by the measurement means), and a portion of the multi-layer film formed by the film formation means is controlled (by the control means) on the basis of the measured optical characteristic of the optical component. Here, by selecting a portion exerting the largest effect on the optical characteristic of the optical component as the above portion of the multi-layer film, the optical component having a good optical characteristic can be formed. Further, since the thickness of only a portion of the multi-layer film is measured, the film thickness control can be easily performed. As a result, it is possible not only to produce an optical component having a good optical characteristic but also to produce a plurality of optical components without a variation in optical characteristic therebetween.

In the apparatus according to the first aspect of the present invention, preferably, the measurement means measures a transmittance of the optical component, and the control means terminates the film formation by the film formation means at the portion of the multi-layer film when the measured transmittance of the optical component is changed to be decreased.

In the method according to the second aspect of the present invention, preferably, the measurement step includes the step of measuring a transmittance of the optical component; and the control step includes the step of terminating the film formation at the portion of the multi-layer film when the measured transmittance of the optical component is changed to be decreased.

With these configurations, the transmittance of the optical component is measured (by the measurement means), Id and the film formation (by the film formation means) at the portion of the multi-layer film is terminated when the measured transmittance of the optical component is changed to be decreased. As a result, an optical component, which is composed of the multi-layer film exhibiting a good optical characteristic formed on the base, can be obtained.

The above preferable apparatus, specifying the transmittance as the optical characteristic, according to the first aspect of the present invention, may further include removal means for removing the layer portion formed during a period of time from a time point when the increase/decrease of the measured transmittance of the optical component is stopped to a time point when the measured transmittance is changed to be decreased.

The above preferable method, specifying the transmittance as the optical characteristic, according to the second aspect of the present invention, may further include a removal step of removing a layer portion formed during a period of time from a time point when the increase/decrease of the measured mean light transmittance of the optical component is stopped to a time point when the measured mean light transmittance is changed to be decreased.

With these configurations, since a layer portion formed during a period of time from a time point when the increase/decrease of the measured transmittance of the optical component (by the measurement) is stopped to a time point when the measured transmittance is changed to be decreased is removed (by the removal means), the layer thickness can be finely adjusted. As a result, it is possible to produce an optical component capable of more accurately exhibiting a good optical characteristic.

In the apparatus according to the first aspect of the present invention, preferably, the control means controls a thickness of one layer of the plurality of alternately stacked layers, the one layer having a higher refractive index and being positioned near the uppermost surface remotest from the base.

In the method according to the second aspect of the present invention, preferably, the control steps include the step of controlling a thickness of one layer of the plurality of alternately stacked layers, the one layer having a higher refractive index and being positioned near the uppermost surface remotest from the base.

With these configurations, a thickness of one layer of the plurality of alternately stacked layers constituting the multi-layer film is controlled (by the control means). The one layer has a higher refractive index and is positioned near the uppermost surface remotest from the base. It has been found by the present inventors that, of the plurality of alternately stacked layers, one layer having a higher refractive index and being positioned near the uppermost surface remotest from the base exerts a large effect on the optical characteristic of the optical component. As a result, by controlling the thickness of such a layer (by the control means), it is possible to produce an optical component having a good optical characteristic.

BRIEF DESCRIPTION OF THE DRAWINGS

FIG. 3 is a sectional view showing one example of a cross-sectional structure of an optical component formed by the optical thin layer forming apparatus;

FIG. 12 is a diagram showing an actual change in mean transmittance in the case of gradually increasing the thickness of an optical thin layer by using the optical monitor;

DETAILED DESCRIPTION OF THE PREFERRED EMBODIMENT

Hereinafter, a preferred embodiment of the present invention will be described with reference to the accompanying drawings.

Figure 1:
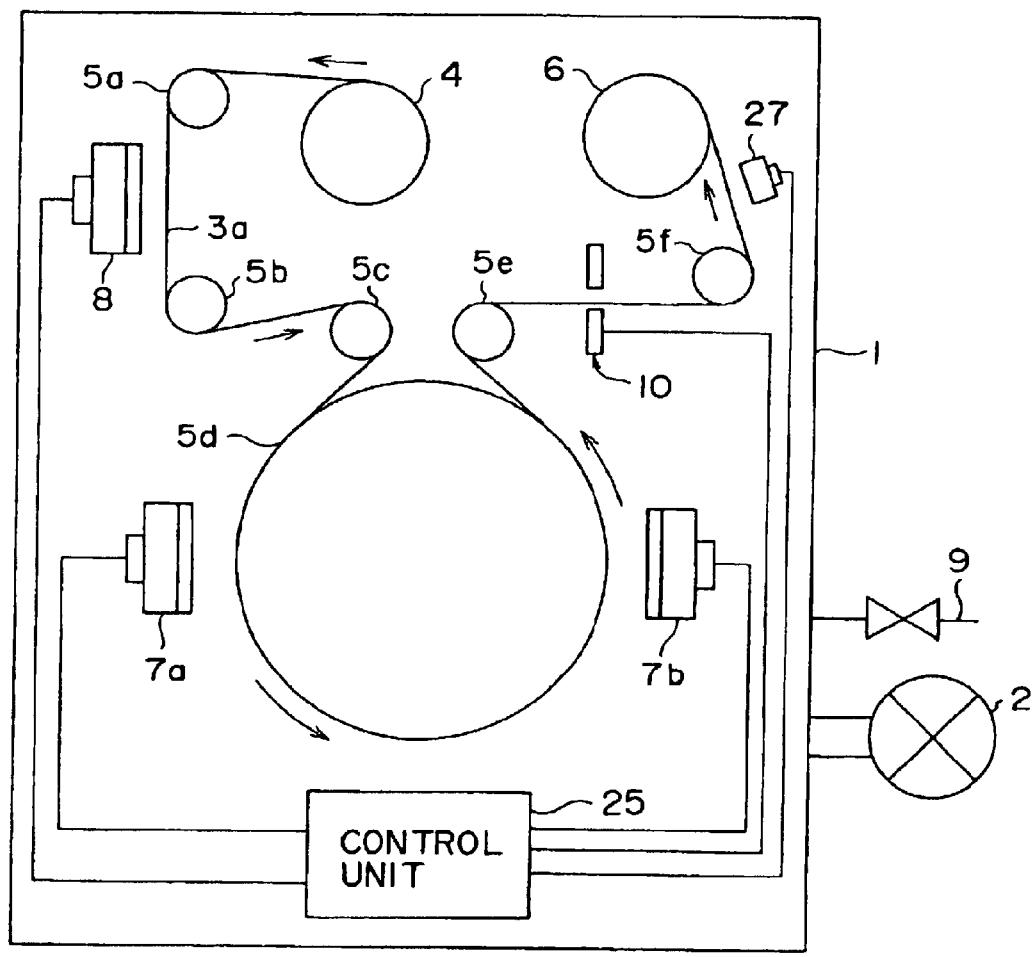
FIG. 1 is a plan view showing a configuration example of an optical thin layer forming apparatus as a preferred embodiment of the present invention.

FIG. 1 is a plan view showing a configuration example of an optical thin layer forming apparatus 1 as a preferred embodiment of the present invention.

The optical thin layer forming apparatus or optical component producing apparatus 1 is used for forming optical thin layers on a base such as a high polymer film. Specific examples of the optical components produced by the apparatus 1 may include an dichroic mirror used for a projection television, an UV-IR filter (ultraviolet rays and infrared rays cutting filter), and a band filter. The following description will be made by using a dichroic mirror as an optical component.

The optical thin layer forming apparatus 1 has a feed roll 4 (film formation means), a winding roll 6 (film formation means), guide rolls 5a, 5b, 5c, 5d, 5e, and 5f (film formation means), a plasma electrode 8 (film formation means), evaporation sources 7a and 7b (film formation means), and an optical monitor 10 (measurement means). A gas lead valve 9 and an evacuation system 2 are connected to the apparatus 1. Preferably, the apparatus 1 has removal means 27.

A running system (film formation means) runs at a constant speed, a base 3a from the feed roll 4 to the winding roll 6 by way of the guide rolls 5a, 5b, 5c, 5d, and 5f. The plasma electrode 8, which is used for preparation such as degassing of the base 3a, is opposed to a portion, disposed between the guide rolls 5a and 5b, of the base 3a. The evaporation sources 7a and 7b, each of which is configured typically as a sputtering system, are disposed with their targets opposed to the guide roll 5d. The target is made from Si, Nb or the like as an optical thin layer material.

The gas lead valve 9, which is connected to the apparatus 1, is used for adjusting, upon sputtering, the flow rate of a reaction gas to be supplied in the apparatus 1 such as argon (Ar) gas or oxygen gas. While not shown, the guide roll 5d has a cooled structure for preventing the temperature rise of the base 3a upon film formation.

The optical monitor 10 is used for measuring an optical characteristic of an optical component obtained by forming optical thin layers on the surface of the base 3a. The optical characteristic to be measured is represented by a light transmittance, preferably, a mean light transmittance of an optical component. Since the apparatus 1 has the optical monitor 10, it can accurately measure a mean light transmittance of an optical component obtained by forming a multi-layer film having a plurality of optical thin layers.

The removal means 27, which is operated by a control unit 25, is used for removing an excess layer portion formed in a period of time from a time point at which the increase/decrease of a mean light transmittance measured by the optical monitor 10 is stopped to a time point at which the mean light transmittance is changed to be decreased. With this configuration, since the apparatus 1 can remove the above excess layer portion, the layer thickness can be finely adjusted. Accordingly, the apparatus 1 can produce an optical component having a good optical characteristic.

Figure 2:
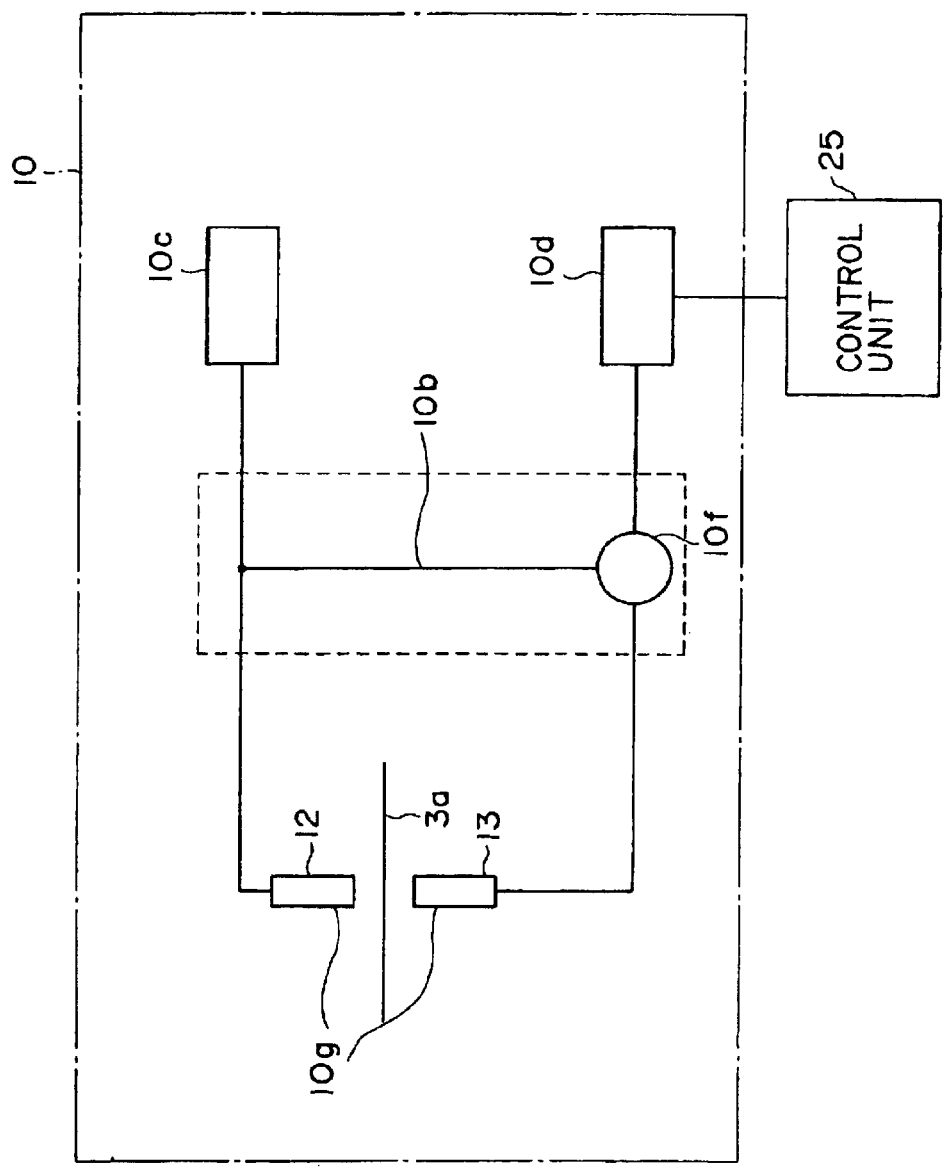
FIG. 2 is a block diagram showing a configuration example of an optical monitor shown in FIG. 2.

FIG. 2 is a block diagram showing a configuration example of the optical monitor 10 shown in FIG. 1.

The optical monitor 10 includes an optical source 10c, an optical head 10g, and a spectroscope 10d. The optical monitor 10 preferably further includes a switch 10f. These devices are connected to each other via optical communication lines such as optical fibers except for a signal line for connecting the spectroscope 10d to the control unit 25.

The optical head 10g has a light emitting unit 12 and a light receiving unit 13. The light emitting unit 12 is a light source enabling continuous emission of light having a wavelength of 450 to 700 nm, that is, a light source having a continuous spectrum of 450 to 700 nm in wavelength. The light emitting unit 12 is configured as an LED (Light Emitting Device). The light receiving unit 13 is configured as a photodiode for detecting a continuous spectrum of 450 to 700 nm in wavelength. The light emitting unit 12 and the light receiving unit 13 are opposed to each other with the running base 3a put therebetween. The light emitting unit 12 is connected to the light source 10c. The light source 10c, in principle, supplies a specific quality of light. An optical communication line 10b extending from the switch 10f is connected to a mid point of the communication line between the light emitting unit 12 and the light source 10c.

The light receiving unit 13 is connected to the spectroscope 10d, and preferably, the switch 10f to which the optical communication line 10b is connected is provided between the light receiving unit 13 and the spectroscope 10d. The light receiving unit 13 receives a light component, passing through the base 3a, of light emitted from the light emitting unit 12. The switch 10f detects a variation in quality of light emitted from the light source 10c by way of the optical communication line 10b. Accordingly, if the quality of light emitted from all the light source 10c varies, the spectroscope 10d can detect a rate of the quality of light received by the light receiving unit 13 to the quality of light emitted from the light emitting unit 12 in consideration of the increased/decreased quality of light.

The spectroscope 10d is connected to the control unit 25 and is controlled by the control unit 25. The spectroscope 10d can accurately calculate a rate (transmittance) of a light component, passing through the base 3a, of light emitted from the light emitting unit 12 by the function of the switch 10f. The transmittance thus calculated is supplied to the control unit 25.

The control unit 25 controls a thickness of a portion of the multi-layer film to be formed on the optical component on the basis of the transmittance (or mean transmittance) thus supplied thereto. Of the multi-layer film to be formed on the optical component, one film layer (tuning layer 32 in FIG. 3) having a higher refractive index and being positioned near the uppermost surface remotest from the base is controlled by the control unit 25. The tuning layer 32, which is a higher refractive index layer of the multi-layer film composed of layers different in refractive index to be described later, exerts a large effect on the optical characteristic of the optical component. As a result, by controlling the thickness of the tuning layer 32 by means of the control unit 25, it is possible to produce an optical component having a good optical characteristic.

FIG. 3 is a sectional view showing one example of a cross-sectional structure of an optical component formed by the optical thin layer forming apparatus 1 shown in FIG. 1.

An optical component includes the base 3a, a hard coat layer 3b, a lower refractive index layer 3c', and a multi-layer film 30, which are arranged in this order from bottom to top. The multi-layer film 30 is obtained by forming lower refractive index layers 3c and higher refractive index layers 3d one by one in such a manner that the layers 3c and 3d are alternately stacked. To be more specific, the optical component is obtained by repeating alternative stacking of the lower refractive index layers 3a and higher refractive index layers 3d by 21 times on the base 3a covered with the hard coat layer 3b via the lower refractive index layer 3c'.

The determination of the position of the tuning layer 32 in the multi-layer film 30 will be described below.

FIGS. 4A to 11B are characteristic diagrams showing examples of transmittance distributions relative to wavelengths of light. In these figures, the abscissa indicates the wavelength (nm) and the ordinate indicates the transmittance (%). In addition, values described beside curves showing optical characteristics in each of FIGS. 4A to 11B designate thicknesses of the tuning layers 32.

Figure 4A:
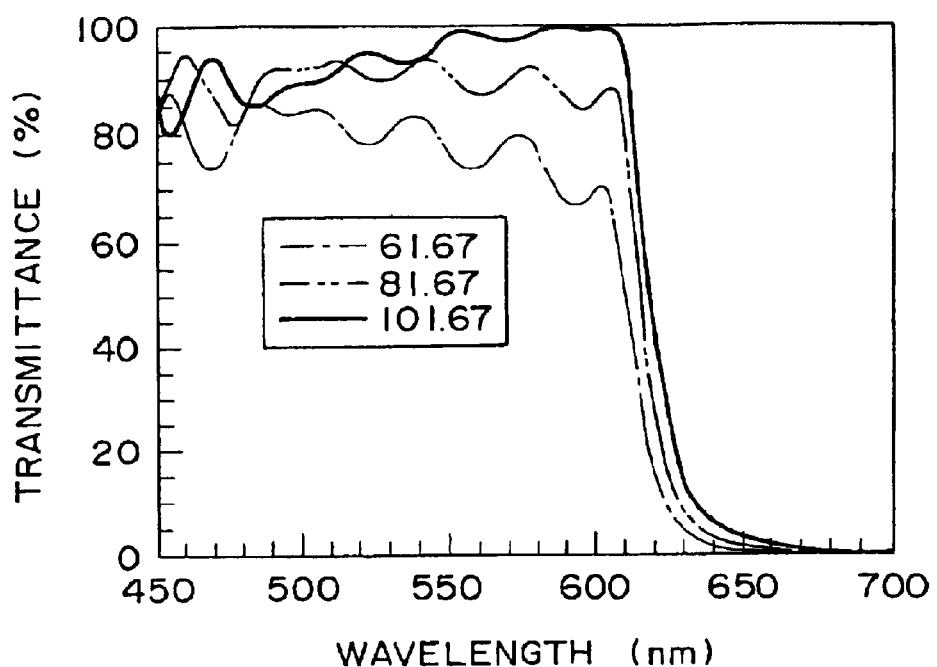
FIGS. 4A to 11B are characteristic diagrams showing examples of transmittance distributions relative to wavelengths of light.
Figure 4B:
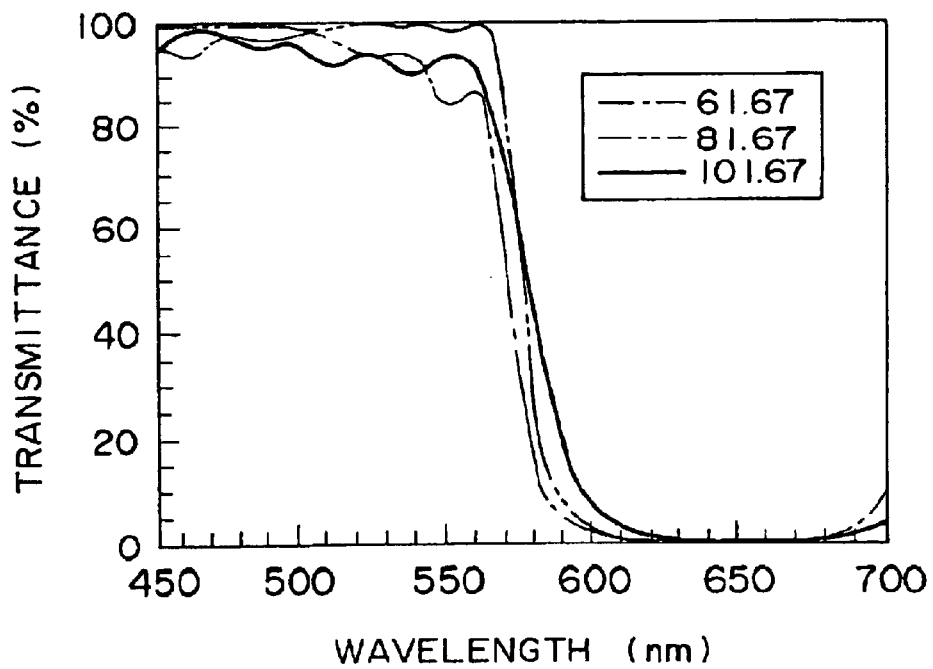
Figure 5A:
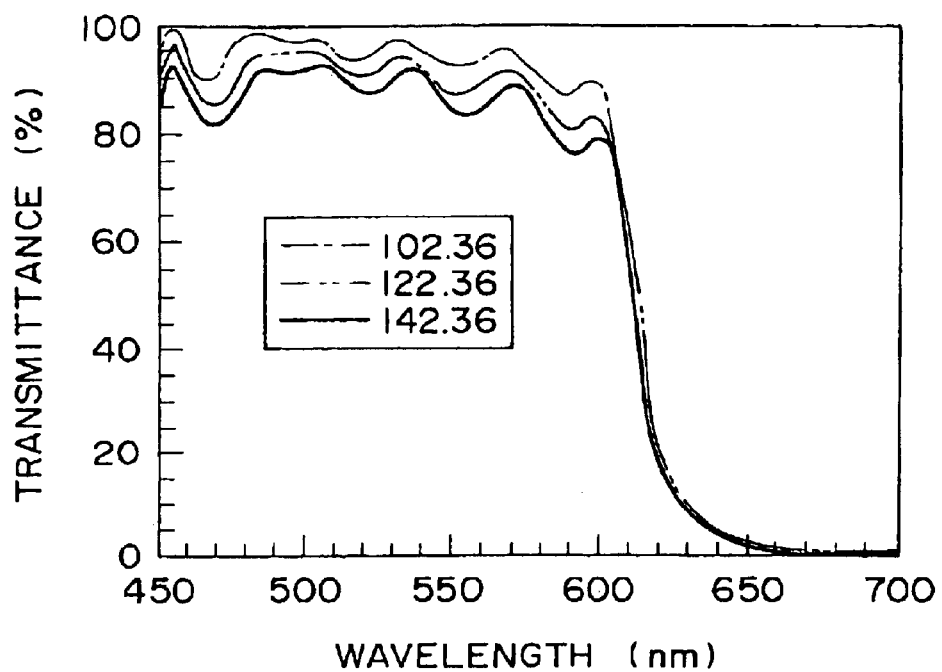
Figure 5B:
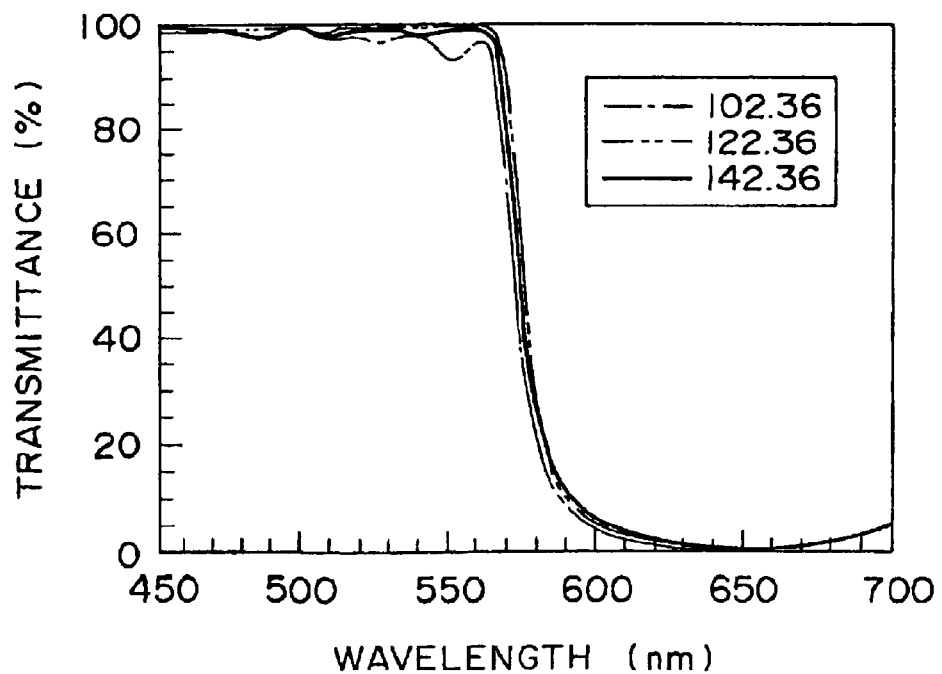
Figure 6A:
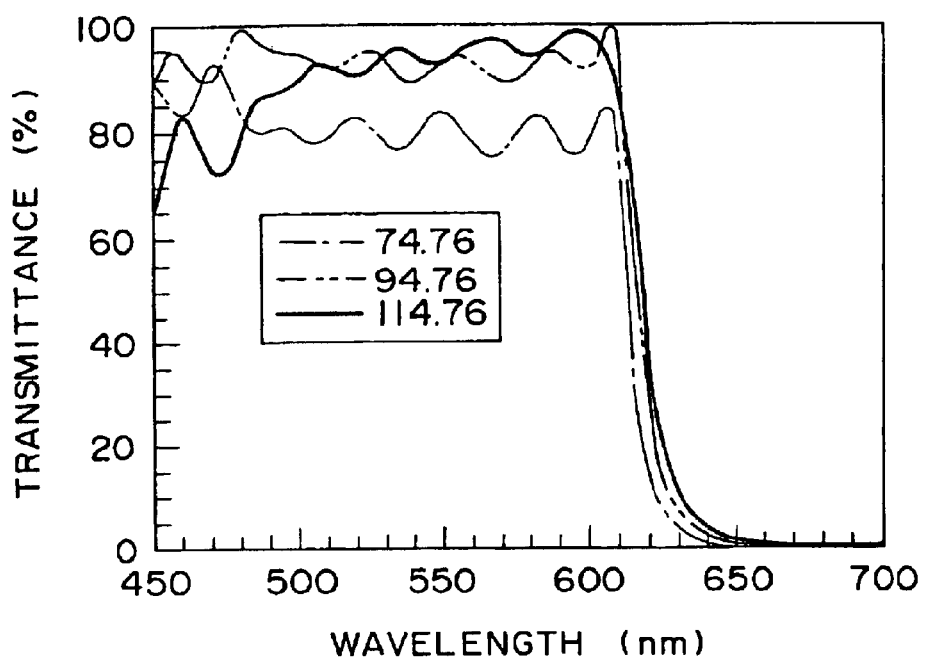
Figure 6B:
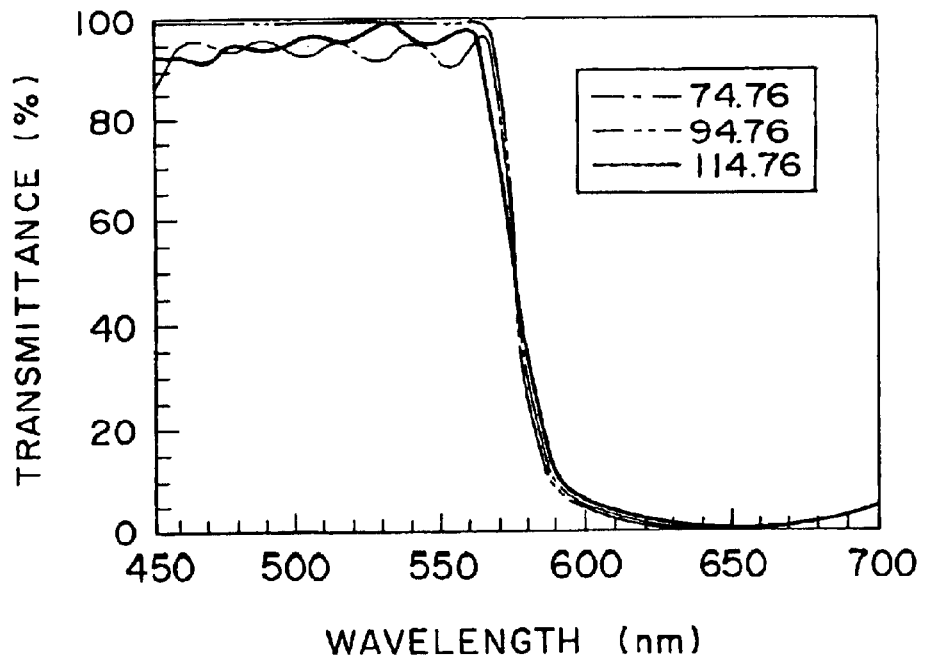
Figure 7A:
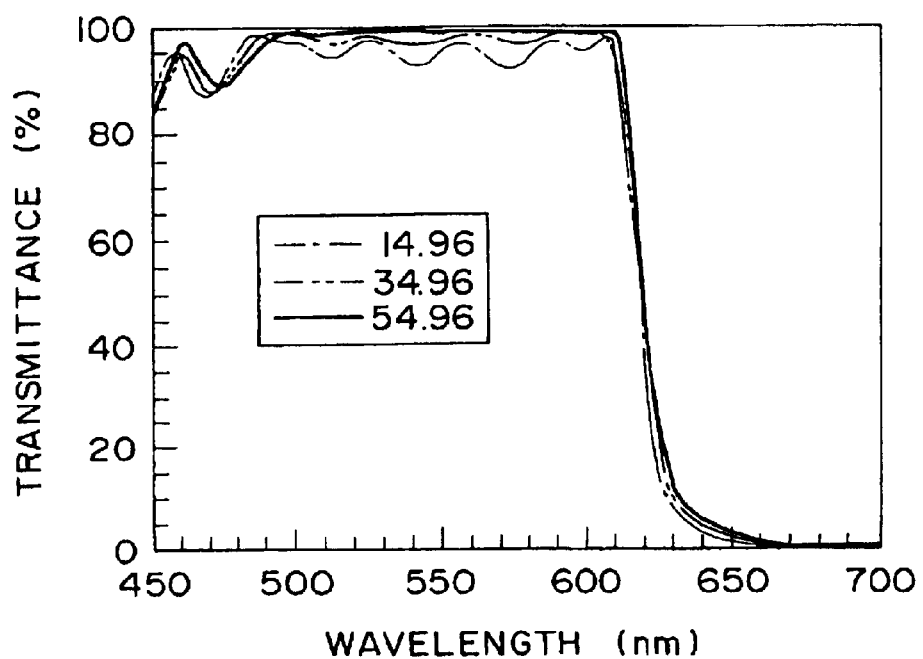
Figure 7B:
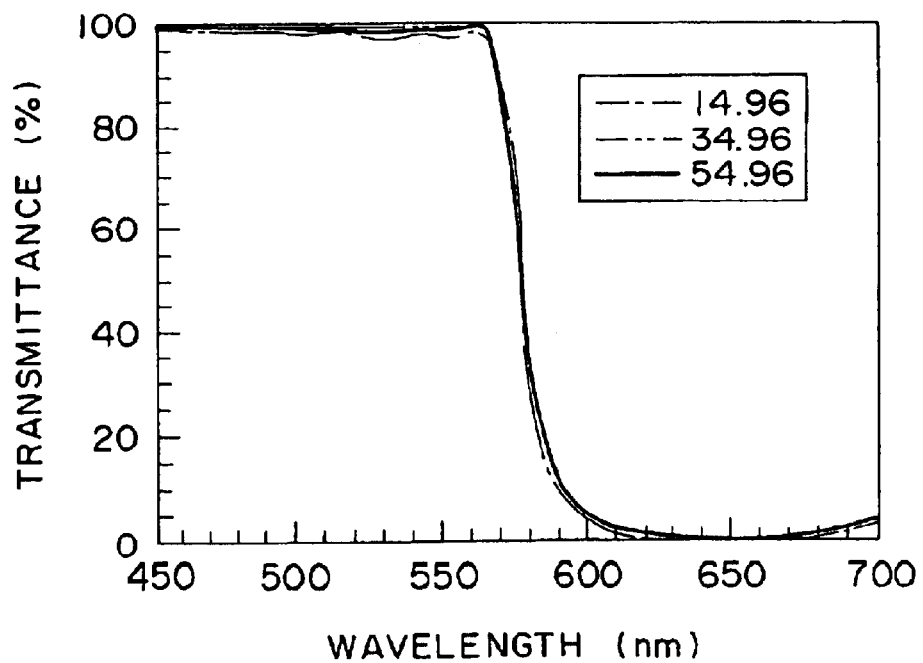
Figure 8A:
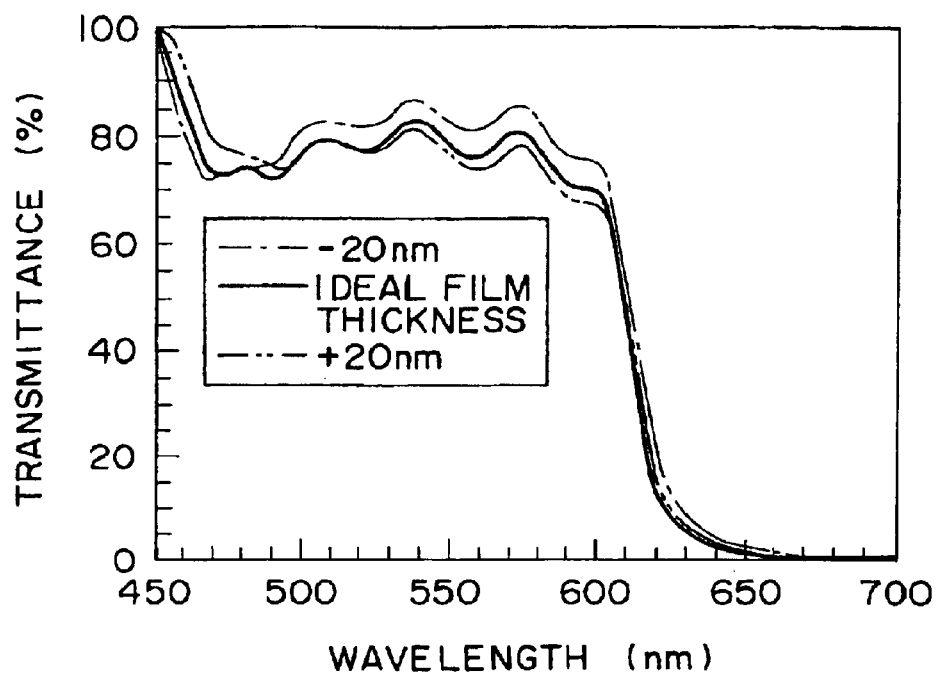
Figure 8B:
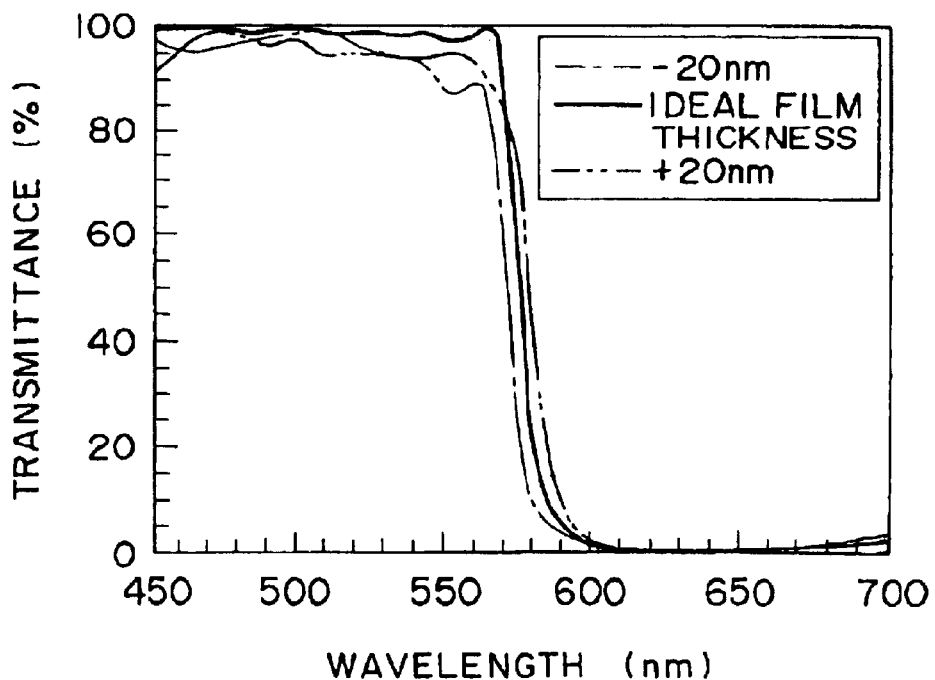
Figure 9A:
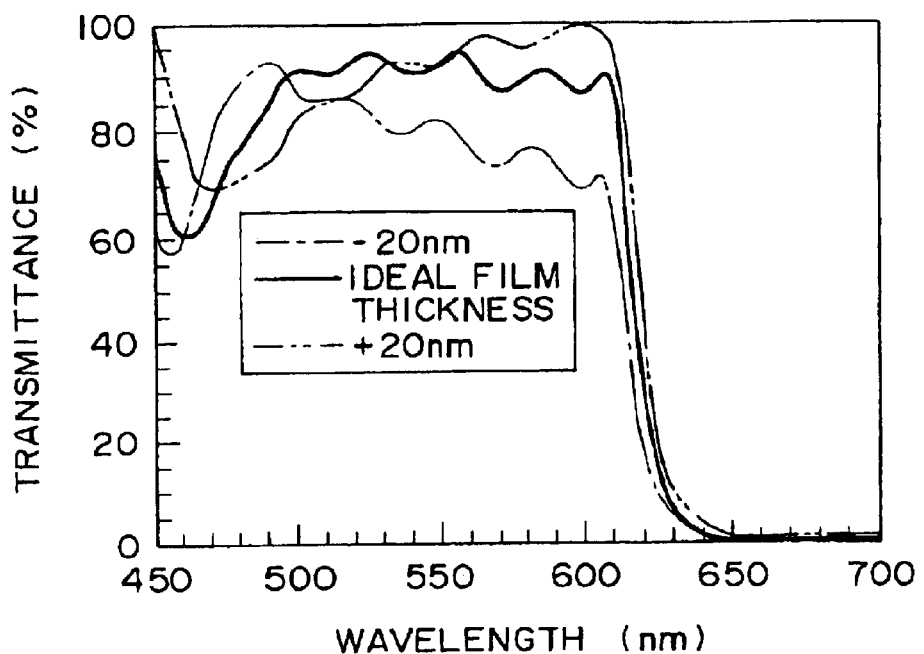
Figure 9B:
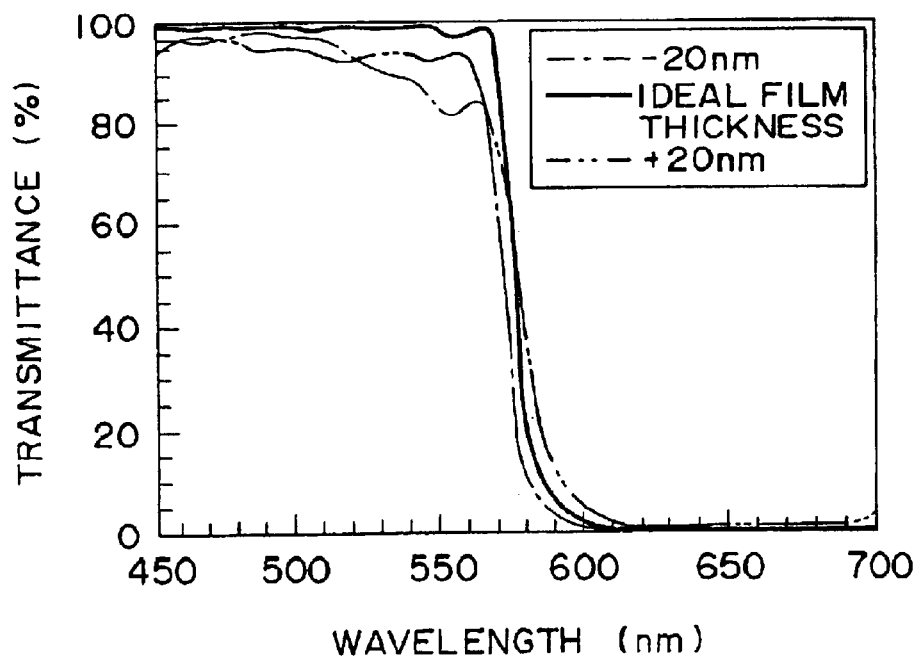
Figure 10A:
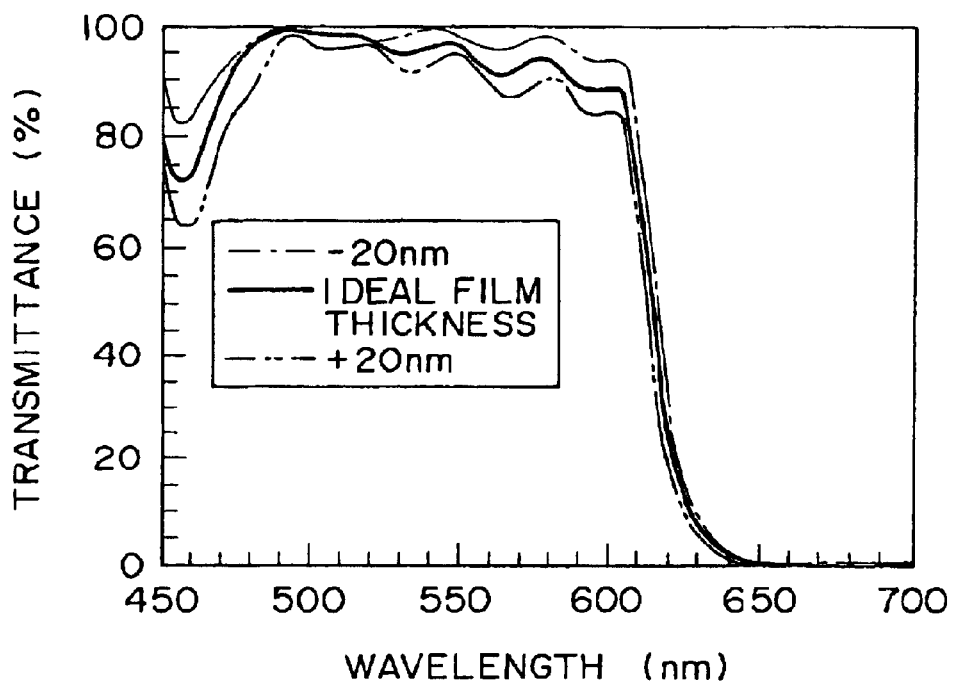
Figure 10B:
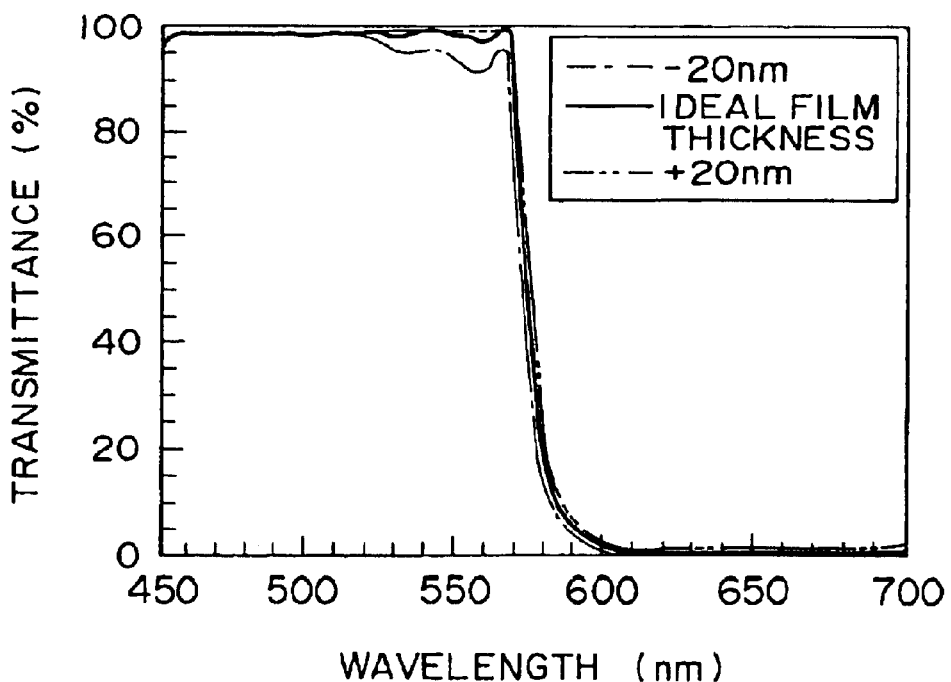
Figure 11A:
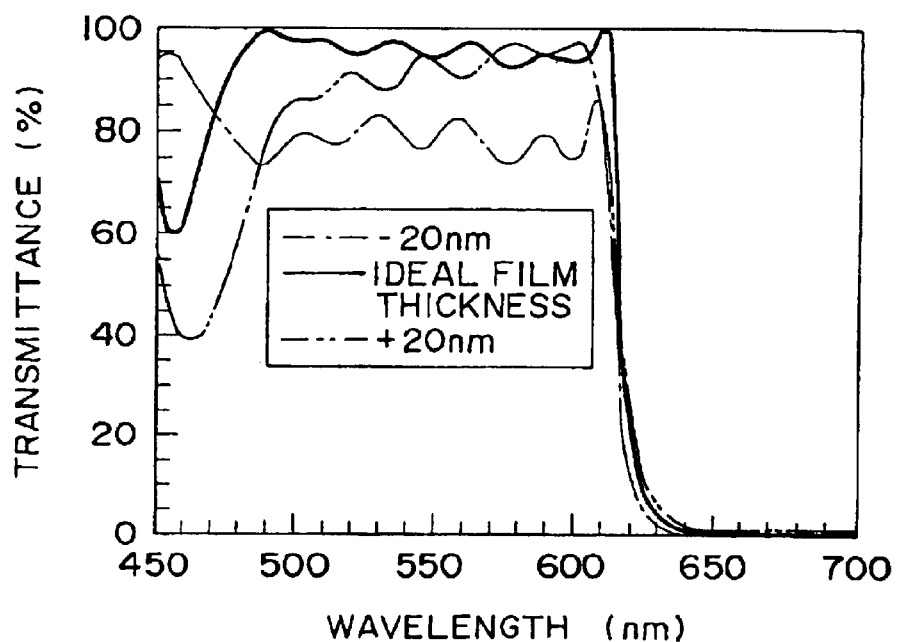
Figure 11B:
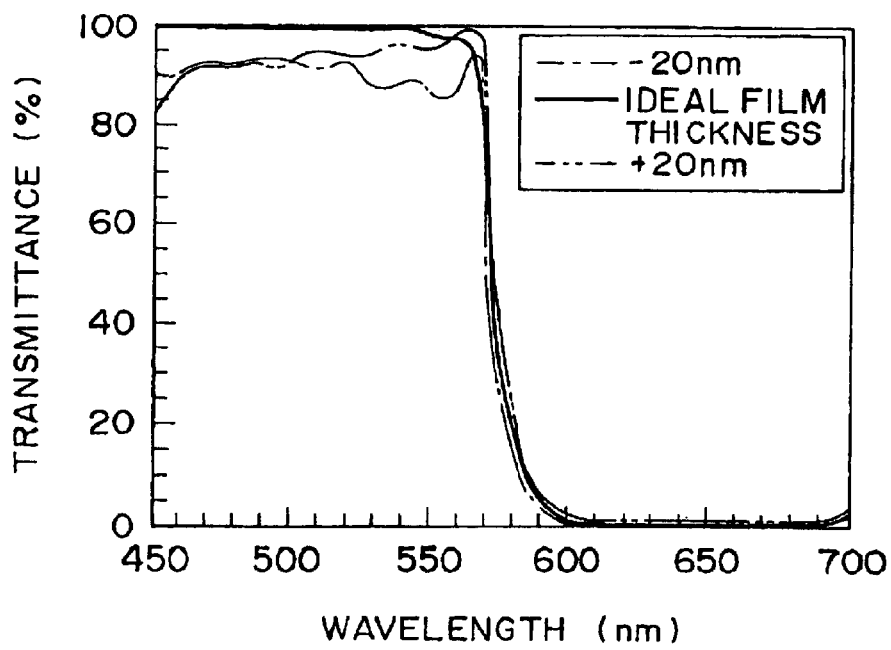

FIG. 4A shows optical characteristics for light incident on the base 3a in the vertical direction, which are examples of optical characteristics showing the results outputted from the optical monitor 10, and FIG. 4B shows optical characteristics for light incident on the base 3a at an angle of 45° with respect to the vertical direction, which are examples of optical characteristics of optical components (dichroic mirrors in this embodiment).

FIGS. 5A, 6A, 7A, 8A, 9A, 10A and 11A are each similar to FIG. 4A; and FIGS. 5B, 6B, 7B, 8B, 9B, 10B and 11B are each similar to FIG. 4B.

FIGS. 4A to FIG. 7B show the transmittance characteristics relative to wavelengths of light for an optical component including the multi-layer film 30 obtained by stacking the lower refractive index layers 3c, higher refractive index layers 3d, lower refractive index layers 3c, . . . , higher refractive index layers 3d, and lower refractive index layers 3c in this order from bottom to top. The tuning layer 32 is set at the 18th layer in FIGS. 4A and 4B, the 19th layer in FIGS. 5A and 5B, the 20th layer in FIGS. 6A and 6B, and the 21st layer in FIGS. 7A and 7B.

From the optical characteristics of the dichroic mirror, it becomes apparent that depending on a change in layer thickness, the optical characteristic of the higher refractive index layer 3d is changed larger than the optical characteristic of the lower refractive index layer 3c does. Further, as the results outputted from the optical monitor 10 shown in FIGS. 4A, 5A, 6A and 7A, in the case where the tuning layer 32 is taken as the 20th higher refractive index layer 3d, the transmittance becomes the peak value at the ideal thickness in the transmission wavelength band (450 to 550 nm); while in the case where the tuning layer 32 is taken as the 18th high refractive index layer 3d, the transmittance does not become the peak value at the ideal thickness in the transmission wavelength band (450 to 550 nm).

FIGS. 8A to FIG. 11B show the transmittance characteristics relative to wavelengths of light for an optical component including the multi-layer film 30 obtained by stacking the higher refractive index layers 3d, lower refractive index layers 3c, higher refractive index layers 3d, . . . , lower refractive index layers 3c and higher refractive index layers 3d in this order from bottom to top. The tuning layer 32 is set at the 18th layer in FIGS. 8A and 8B, the 19th layer in FIGS. 9A and 9B, the 20th layer in FIGS. 10A and 10B, and the 21st layer in FIGS. 11A and 11B.

From the optical characteristics of the dichroic mirror, it becomes apparent that depending on a change in layer thickness, the optical characteristic of the higher refractive index layer 3d is changed larger than that of the lower refractive index layer 3c. Further, as the results outputted from the optical monitor 10 shown in FIGS. 8A, 9A, 10A and 11A. In the case where the tuning layer 32 is taken as the 21st higher refractive index layer 3d, the transmittance becomes the peak value at the ideal thickness in the transmission wavelength band (450 to 550 nm); while in the case where the tuning layer 32 is taken as the 19th high refractive index layer 3d, the transmittance does not become the peak value at the ideal thickness in the transmission wavelength band (450 to 550 nm).

As is apparent from the above-described simulation, it may be desirable that, of the plurality of alternately stacked layers constituting the multi-layer film 30 formed on the optical component, the higher refractive index film 3d positioned near the uppermost surface remotest from the base 3a be set as the tuning layer 32.

Next, one example of a method of producing an optical component using the optical component producing apparatus will be described with reference to FIGS. 1 to 3, and FIGS. 12 and 13.

In the optical thin layer forming apparatus 1, the base 3a having a thickness of 188 μm, made from polyethylene naphthalate, is set on the feed roll 4 to be wound around the winding roll 6 by way of the guide rolls 5a, 5b, 5c, 5d, 5e, and 5f.

An SiOx (x is a positive number of 2 or less) is formed on the base 3a by sputtering the evaporation source 7a having an Si target while adjusting a flow rate of each of Ar gas and oxygen gas. Subsequently, 21 optical thin layers made from $SiO_2$ and $Nb_2O_5$ are formed one by one to satisfy a predetermined optically designed configuration by alternately sputtering the evaporation source 7b having an Nb target and the evaporation source 7a having the Si target while adjusting a flow rate of each of Ar gas and oxygen gas. In addition, the SiOx layer is taken as one of the $SiO_2$ layers of the above 21 layers.

Upon formation of the optical thin layers, to reduce a stress applied to the optical thin layers, the flow rate of each of Ar gas and oxygen gas for sputtering is adjusted by the gas lead valve 9 to change the sputtering pressure. For example, while the usual sputtering pressure is about 0.3 Pa, the sputtering pressure used in this embodiment is set at about 1.6 Pa, to reduce the entire internal stress of the optical thin layers while adjusting the balance in stress between $SiO_2$ and $Nb_2O_5$, thereby reducing a curling of the film-like base 3a.

With respect to the base 3a, previously, a hard coat layer is formed on the surface on which optical thin layers are to be formed, and an adhesive layer is formed on the opposed surface to the optical thin layer formation surface and a protective film is formed on the adhesive layer. Since the base 3a made from polyethylene naphthalate has a high heat resistance, that is, a high resistance against thermal deformation, optical thin layers can be uniformly formed on the base 3a. For example, polyethylene naphthalate having a glass transition point of 110° C. is superior in heat resistance to polyethylene terephthalate having a glass transition point of 69° C.

A glass plate having a width of 5 cm, a length of 8.75 cm, and a thickness of 1 mm is prepared as a transparent member. The base 3a, on which the optical thin layers have been formed, is laminated on the transparent member via an adhesive, and is then cut into a size matched to that of the glass plate. In this way, an optical component applicable to a dichroic mirror used for typically a projection television is finished. In addition, a protective film formed on an adhesive layer may be used as the transparent member.

As described above, the optical monitor 10 is essential for stably producing an optical component (optical filter) having a high quality.

Figure 13:
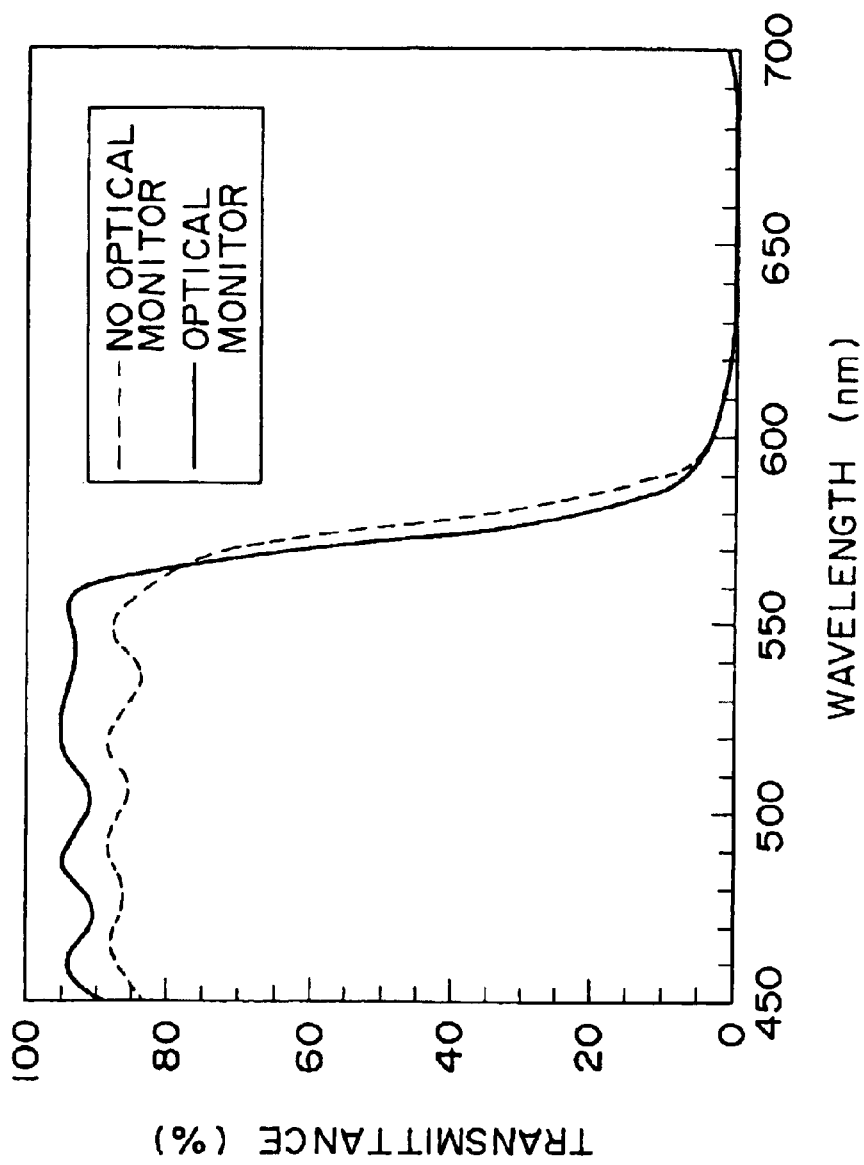
FIG. 13 is a diagram showing one example of a difference in final transmittance distribution between an optical component in which the thickness adjustment by using the optical monitor is performed and an optical component in which the thickness adjustment by using the optical component is not performed.
Figure 14:
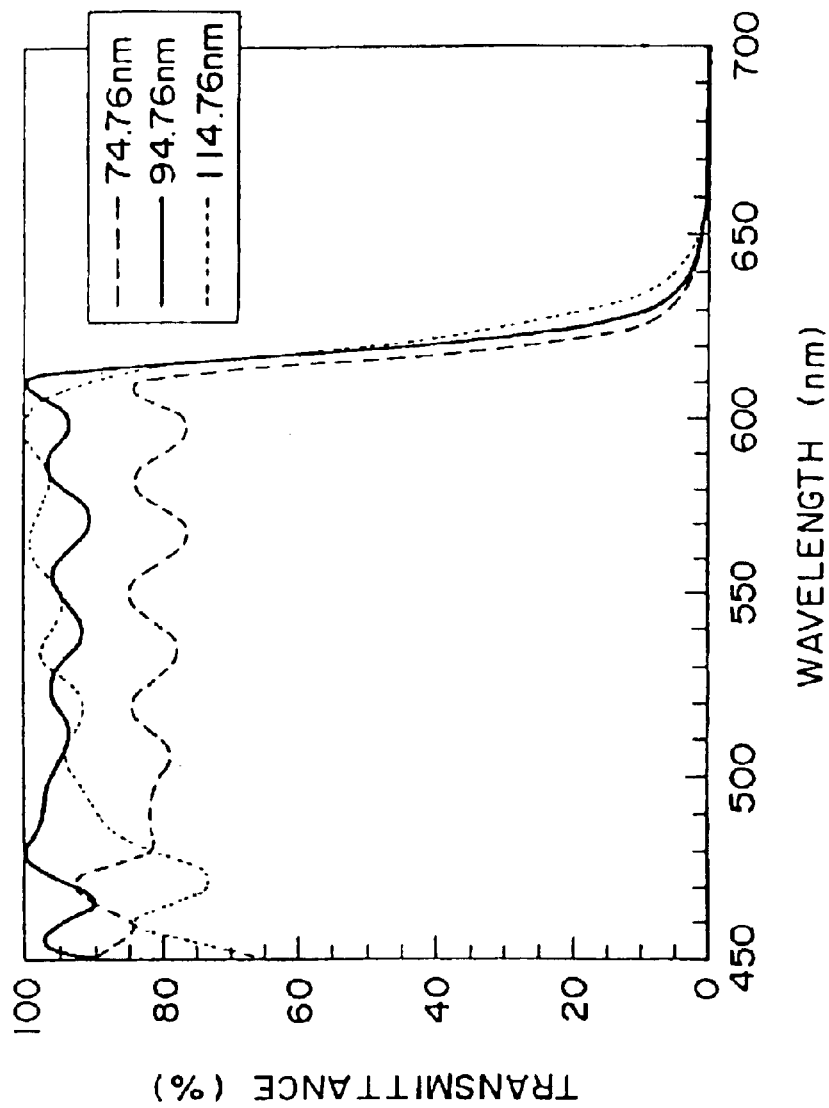
FIG. 14 is a characteristic diagram showing one example of a transmittance distribution relative to wavelengths of light for an optical component formed by a related art optical thin layer producing method.
Figure 15:
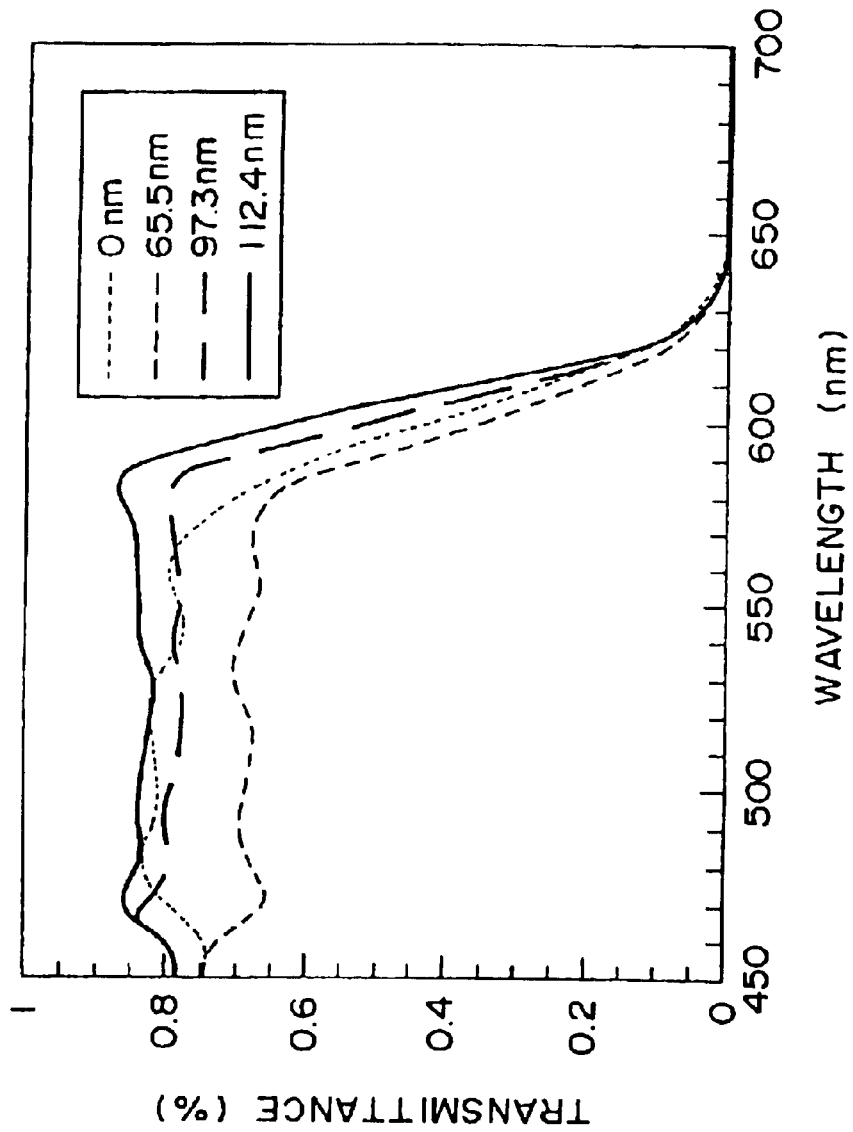
FIG. 15 is a characteristic diagram showing one example of a transmittance distribution relative to wavelengths of light for an optical component formed by the related art optical thin layer producing method.

FIG. 12 is a diagram showing one example of simulation of a change in mean transmittance in the case of gradually increasing the thickness of an optical thin layer by using the optical monitor, and FIG. 13 is a diagram showing one example of a difference in final transmittance distribution between an optical component in which the thickness adjustment by using the optical monitor is performed and an optical component in which the thickness adjustment by using the optical monitor is not performed.

FIG. 12 shows a change in mean transmittance in the case of changing the thickness of the tuning layer 32 by about ±20 μm in the case where light is made incident on the base in the vertical direction. The ideal thickness of the tuning layer is typically 94.76 nm. The mean transmittance of the tuning layer 32 is increased as the thickness thereof is gradually increased from 74.76 nm, reaching the peak value when the thickness of the layer 32 is increased to about 94.76 nm, and is changed to be decreased as the thickness of the layer 32 is further increased. Further, as shown in FIG. 13, the mean transmittance in a transmission wavelength band (450 to 550 nm) of the optical component in which the thickness adjustment by using the optical monitor 10 is performed is about 7% higher than that of the optical component in which the thickness adjustment by using the optical monitor 10 is not performed. Accordingly, it is possible to produce an optical component having a high quality by using the optical monitor 10.

According to this embodiment, it is possible to easily, stably produce an optical component having a good optical characteristic.

While the preferred embodiment has been described using the specific terms, such description is for illustrative purposes only, and it is to be understood that changes and variations may be made without departing from the spirit or scope of the following claims.

What is claimed is:

1. An optical component producing method for forming a multi-layer film, on a base, comprising:
    depositing a lower refractive index layer on said base and a higher refractive index layer on said lower refractive index layer;
    alternating said lower refractive index layer with said higher refractive index layer for a plurality of layers forming a basis for a stack;
    depositing a tuning layer having a higher refractive index on said plurality of layers, thus forming the stack;

measuring an optical characteristic of the optical component obtained by forming the stack on the base, wherein the measurement step comprises measuring a transmittance of the optical component formed from the stack during depositing of said tuning layer;

controlling, on a basis of the measured optical characteristic of the optical component, a thickness of said tuning layer by terminating the film formation at said tuning layer when the measured transmittance of the optical component is changed to be decreased;

removing a layer portion formed during a period of time from a time point when the increase/decrease of the measured mean light transmittance of the optical component is stopped to a time point when the measured mean light transmittance is changed to be decreased; and depositing a lower refractive index layer on said tuning layer, thereby forming the multi-layer film.

2. The method of claim 1, wherein each of the lower refractive index layers is $SiO_2$ and each of the higher refractive index layers is $Nb_2O_5$.

3. A method for forming an optical component, comprising:

(i) depositing a plurality of optical layers on a base to form a surface, said plurality of optical layers comprising alternating layers of lower refractive indices and higher refractive indices, said plurality of layers forming a stack; and (ii) controlling a thickness of one layer of said plurality of optical layers, by (a) depositing a tuning layer having a higher refractive index on the surface of the plurality of optical layers to form a stack, wherein the tuning layer is the one layer and defines a thickness, (b) measuring an optical characteristic of the stack to obtain a first optical characteristic value, (c) measuring the optical characteristic of the stack after continued deposition of said tuning layer to obtain a second optical characteristic value, (d) determining whether the second optical characteristic value has decrease as compared to the first optical characteristic value, (e) when the second optical characteristic value has not decreased, continuing the depositing of the tuning layer to add the stack and returning to steps (ii)(b)–(e), and when the second optical characteristic measured has decreased, terminating the depositing of the tuning layer and removing a portion of the tuning layer formed during a period of time, wherein the period of time is defined from a time point when an increase/decrease of the second optical characteristic measured of the stack is stopped to a time point when the second optical characteristic measured is changed to be decreased, and (f) adding a layer of a lower refractive index on the tuning layer, thereby forming a milti-layer film.

* * * * *